United States Patent [19]

Hynecek

[11] Patent Number: 4,679,212
[45] Date of Patent: Jul. 7, 1987

[54] METHOD AND APPARATUS FOR USING SURFACE TRAP RECOMBINATION IN SOLID STATE IMAGING DEVICES

[75] Inventor: Jaroslav Hynecek, Richardson, Tex.

[73] Assignee: Texas Instruments Incorporated, Dallas, Tex.

[21] Appl. No.: 636,425

[22] Filed: Jul. 31, 1984

[51] Int. Cl.[4] .............................................. G11C 19/28
[52] U.S. Cl. ........................................ 377/58; 357/24
[58] Field of Search ............... 357/24 LR, 24; 377/57, 377/58, 63

[56] References Cited

U.S. PATENT DOCUMENTS

| | | | |
|---|---|---|---|
| 3,931,465 | 1/1976 | Levine | 357/30 X |
| 4,229,752 | 10/1980 | Hynecek | 357/24 |
| 4,328,432 | 5/1982 | Yamazaki | 357/30 X |
| 4,375,597 | 3/1983 | Kosonocky | 357/24 LR X |
| 4,485,315 | 11/1984 | Collet et al. | 357/24 LR X |

OTHER PUBLICATIONS

Levine, Peter A., "Method for Varying Gamma in Charge-Coupled Imagers" 1975 IEEE International Solid-State Circuits Conference, 38-39.

Primary Examiner—Andrew J. James
Assistant Examiner—Sara W. Crane
Attorney, Agent, or Firm—Leo N. Heiting; Melvin Sharp

[57] ABSTRACT

The specification discloses a charge transfer imaging device (10) having a charge removal gate (26). Pulses (30) of sufficient amplitude and frequency are applied to gate (26) in order to remove charge from device (10) by electron-hole recombination through interface traps of electrons and holes. Pulses of one amplitude reduce blooming of the device when used as an imager, while pulses of a second amplitude may be used to produce imager aperture control and gamma correction. Further, the charge removal technique may be used to control charge injection device (96) operation.

9 Claims, 28 Drawing Figures

METHOD AND APPARATUS FOR USING SURFACE TRAP RECOMBINATION IN SOLID STATE IMAGING DEVICES

TECHNICAL FIELD OF THE INVENTION

This invention relates to semiconductor devices and more particularly relates to techniques for using surface trap recombination to provide charge reduction in solid-state imaging devices.

BACKGROUND OF THE INVENTION

Solid state imaging devices have become valuable tools in many optical sensing systems. Charge coupled devices (CCD), charge injection devices (CID) and charge transfer devices (CTD) all have been advantageously used in optical sensing arrays. However, prior solid state imaging devices have been plagued by blooming and have generally not provided adequate electronic aperture control or gamma control when used with video camera systems. Moreover, difficulties have arisen when resetting CIDs when used as imagers.

Blooming is an unpleasant phenomenon which has long plagued designers and manufacturers of solid-state imaging devices. Blooming is defined as a signal charge overflow from brightly illuminated cells in an optical array into neighboring cells which are not as highly illuminated, and therefore results in false signal levels in those cells. When a video signal from a solid-state imager is displayed on a monitor, blooming will cause distortion of the image, and in the case of large overflow, a complete saturation of the picture. Blooming viewed on a monitor can take many forms, depending on the particular device structure and technology used to fabricate the imaging device. In buried-channel CCD technology, for example, blooming is particularly persistent, and takes the form of streaks or charge spreading, particularly along the channels of charge transfer.

A number of techniques have heretofore been devised to minimize or eliminate the blooming phenomenon in buried-channel devices. A typical approach has been to incorporate an overflow drain next to each charge collecting element and drain the overflow charge out in a lateral direction. This approach, even though effective in removing charge overload, consumes focal plane area and has been difficult to fabricate.

Another method of anti-blooming utilizes a buried drain which is located beneath the charge storing elements. In this architecture, the overflow charge is drained from the imaging cell in the vertical direction. This method results in a low quantum efficiency in the longer wavelength spectral region, since the majority of the signal charge resulting from such light is generated beneath the buried drain and is thus lost from collection by the charge storage elements.

There have also been previous proposals using various carrier recombination schemes for elimination of undesirable signals. These have been based on recombination in the bulk on oxide precipitates. However, these techniques have created complications in device processing, as well as difficulties with effective implementation for area sensor blooming protection.

A technique for preventing blooming has been proposed which applies alternating voltage to a gate adjacent to the charge storage region of a charge transfer device to put the surface of the semiconductor substrate into an accumulation or depletion state. Electrons trapped at the surface states are recombined with majority carriers in the accumulation state and therefore excess signal charges are trapped at the surface states vacant by the previous recombination, thus resulting in the removal of excess charges. This technique is described in U.S. Pat. No. 4,328,432 by Yamazaki, issued May 4, 1982. However, this technique has not been useful on all types of solid state imaging devices and has not been heretofore useful in providing improved aperture and gamma control, or in resetting CID imagers.

SUMMARY OF THE INVENTION

In accordance with the present invention, surface trap recombination is used to prevent blooming, to provide shutter and gamma control, and to provide improved charge extraction. In one aspect of the invention, a charge transfer device includes a semiconductor substrate of one conductivity type and structure to effect charge transfer along a channel. An insulating layer is provided on the substrate over the channel. A conductive layer is disposed over the insulating layer to receive charge transfer clocking pulses. A charge control gate is disposed adjacent the conductive layer for receiving clocking pulses in order to remove charge through electron-hole recombination. This charge removal may be utilized for imaging aperture control, gamma control or to provide anti-blooming.

In accordance with another aspect of the invention, a charge transfer imaging device is provided with charge control properties and includes a semiconductor substrate of one conductivity type, including a channel for charge transfer. An insulating layer is formed on the substrate over the channel. A plurality of spaced apart conductive electrodes cover the insulating layer over the channel. The channel is divided into a clock phase and a virtual phase between each adjacent electrode. Each of the phases includes a storage and a transfer region. Each of the clock phase and the virtual phase includes a cell of two regions having different impurity profiles. A charge control gate electrode is disposed between adjacent electrodes for receiving charge control clocking pulses to remove charge from the device by electron-hole recombination through interface trapping of electrons and holes. The present charge transfer imaging device may be used as an effective aperture control of the imaging device, or to provide an effective gamma ratio different than unity for the device. Alternatively, the imager may be used to provide anti-blooming control.

In accordance with yet another aspect of the device, a charge injection device used as an imager for sensing illumination includes a semiconductor substrate. An insulating layer is formed on the substrate and a conductive sense electrode is formed on the insulating layer. A conductive address electrode is formed adjacent the sense electrode. Circuitry is coupled to the sense electrode for resetting the sense electrode and for sensing the level of charge stored in the substrate adjacent the sense electrode as a result of illumination. The address electrode is operable to receive pulses of an amplitude sufficient to reduce the charge stored in the potential well adjacent to the sense electrode by electron-hole recombination via interface traps of electrons and holes. In accordance with one aspect of the invention, the pulses may be of an amplitude and frequency sufficient only to reduce excess charge to reduce blooming. In another aspect of the invention, the frequency and amplitude of the pulses may be sufficient to substantially destroy all charge to ready the device for the next sensing cycle.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figures 1, 2A, 3, 4A:
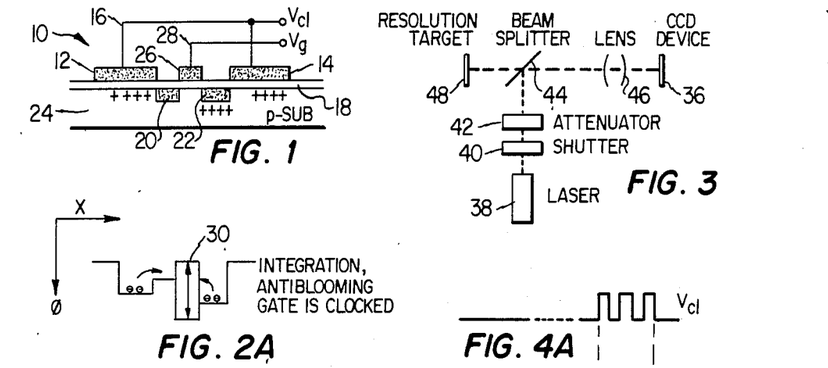
FIG. 1 is an enlarged sectional view of a charge transfer device incorporating the present invention.
FIG. 2a is a potential diagram illustrating the operation of the device shown in FIG. 1a in the integration mode.
FIG. 3 is a block diagram of test apparatus illustrating the operation of a CCD incorporating the present invention.
FIGS. 4A-C illustrate clocking voltages applied to the test structure illustrated in FIG. 3.

Referring to FIG. 1, a charge transfer device known as a virtual phase CCD (VP CCD) 10 is illustrated which incorporates the present invention when used to provide anti-blooming. The VP CCD 10 incorporates single level gate electrodes 12 and 14. Gate electrodes 12 and 14 are interconnected by leads 16 which receive a clocking signal Vcl. The VP CCD 10 is illustrated as a cross-section along the charge transfer channel. As is known, transfer directionality of the device is achieved by placing suitable implants under various portions of the electrodes, as indicated by the "+" signs in FIG. 1. These implants produce permanent potential barriers and wells which are raised and lowered by application of the appropriate voltages on the overlying gates or electrodes 12 and 14 to provide unidirectional charge transfer. The gates 12 and 14 are formed on an oxide layer 18 and P+ type virtual gates 20 and 22 are formed into the p-type silicon surface 24.

A charge reduction gate 26 is formed from the same material as gate electrodes 12 and 14 and is disposed between the electrodes 12 and 14 on the oxide 18. Lead 28 extends from the electrode 26 to receive a gating voltage. As will be subsequently described, the application of suitable charge reduction gating pulses to lead 28 during operation of the VP CCD will essentially eliminate blooming and can also effect shutter and gamma control.

It will be understood that the areas between each of the gates 12 and 14 are divided into a clocked phase and a virtual phase region. Each of the clocked and virtual phase areas includes a storage and a transfer region. Each clocked phase and virtual phase region comprises a cell of two regions, or a total of four regions for the one cell, having different impurity profiles, as is described in detail in U.S. Pat. No. 4,229,752 entitled "Virtual Phase Charge Transfer Device", issued Oct. 21, 1980, by the present applicant. The charge reduction gate electrode 26 is disposed between the third and the fourth regions.

The construction and operation of VP CCDs are well-known and are described, for example, in U.S. Pat. No. 4,229,752 noted above and in the publication "Virtual Phase Technology: A New Approach to Fabrication of Large-Area CCD's" by applicant, published in *IEEE Transactions on Electronic Devices, Volume ED-28*, No. 5, May, 1981. The construction and operation of the VP CCD shown in FIG. 1 is generally described in the above-noted publications. Electrodes 12, 14 and 26 may be constructed, for example, of doped polysilicon or the like. Oxide layer 18 may be formed by oxidation of the mono-crystalline silicon wafer forming the p-type layer 24. The gates 20 and 22 are formed by suitable acceptor impurities such as boron, gallium, or indium. It will, of course, be understood that there are other types of materials and fabrication techniques which may be used to form the illustrated VP CCDs and the other solid state devices disclosed herein.

The present invention may be used with all types of charge transfer devices, including buried-channel, surface channel, and virtual phase CCD devices, as well as CID and CTD devices. The term "charge transfer device" will hereinafter be utilized to include all of the above-noted device types.

In an actual operational imaging device, an imager with a plurality of horizontal lines and vertical pixels per line would be utilized. For example, an imager could be provided with 490 horizontal lines and 581 vertical pixels per line. The imaging section formed from such pixels would have 245 lines, while the memory section would also have 245 lines. Only the imaging section would incorporate the anti-blooming gate 26 in each of the 245 lines. The construction of the present device does not require any process changes from the fabrication of similar devices, and, therefore, enjoys similar high yield attributes available with conventional virtual phase technology. The only additional complexity in this design as compared to devices without blooming protection is a metal interconnect crossover of the clock and the anti-blooming gate buses. The remainder of the imaging device described above is conventional, with a serial register and output amplifier below the memory section in the common manner, which is not herein shown for simplicity of illustration.

Figure 2B:
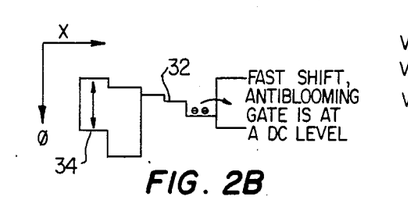
FIG. 2b is a potential diagram illustrating the operation of a device shown in FIG. 1 in the fast shift mode.

The operation of the imager can be understood from FIGS. 2A and 2B. There are two basic modes of clocking. First, the integration mode shown in the device potential profile of FIG. 2A, where the clocked phase Vcl (FIG. 1) is held at an intermediate dc potential and the gate electrode 26 is pulsed between two voltage levels at 30 in order to remove overflow charge. The second mode of operation is the fast shift mode shown in the device potential profile of FIG. 2B, where the gate electrode 26 is held at 32 at a dc potential and the clocked gate Vcl is pulsed between two voltage levels at 34 to facilitate a quick charge transfer into the memory section. The charge overflow control is active during the integration mode only, and the performance of the charge reduction structure is determined by the gate clock frequency and the maximum excursion of the gate pulse. If it is required that the charge reduction gate must also be active during the fast shift, it is possible to clock it with the same frequency as the clocked gate, but with the opposite phase. This will not impair the charge transfer and it may simplify operation in some applications. After completion of the fast shift, the gate frequency can resume its integration period value.

Figure 4B:
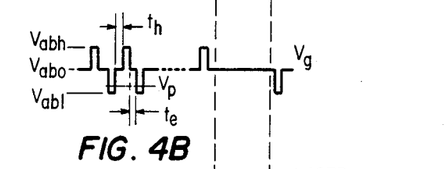

FIG. 3 illustrates a testing setup to evaluate the charge reduction capabilities of the above-described anti-blooming structure. The 490X581 imager described above is indicated by numeral 36. A laser 38 projects a high intensity test beam through a shutter 40 and an attenuator 42. The test beam is reflected through a beam splitter 44 and through a lens 46 to the present CCD device 36. A resolution target 48 which is back illuminated is also projected through the beam splitter 44 on the device 36. The laser beam is shuttered off by the attenuator 42 during the fast shift of the data into the memory section to prevent picture smearing. The CCD device 36 was clocked using the signal shown in FIGS. 4A-C.

Figure 4C:
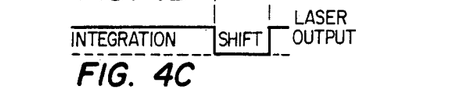

The clock of FIG. 4A is applied to lead 16 of the device shown in FIG. 1, and it may be seen that clock Vcl is maintained at a dc level during the integration portion of the operation and is pulsed between two levels during the shift operation of the device. The clock signal applied to the gate 26 via lead 28 in FIG. 1 is denoted as $V_g$ and is clocked between a high potential of $V_{abh}$ and a low potential $V_{abl}$. The surface pinning bias is designated as $V_p$, which is the level at which holes can flow to the oxide-silicon interface. The voltage applied to the gate electrode 26 during the shift mode is at a dc level. FIG. 4C illustrates the output of the laser during the integration and shift periods.

Experiments were run using the arrangement shown in FIG. 3 with various images. When the CCD device 36 was operated with charge reduction pulses shown in FIG. 4, wherein $V_{abl}$ was biased above the surface pinning potential $V_p$, a substantial blooming occurred on the detected image when the laser beam intensity was much higher than normal exposure levels. However, when the level of the charge reduction gate pulse was extended to below the surface pinning bias $V_p$, essentially no blooming occurred, as the overflow charge was removed. This experiment illustrates the importance of the operation of holes in the recombination process of the present invention, as will be subsequently described in greater detail. The frequency of the clocking applied to the charge reduction electrode can be varied in dependence on a number of factors, including the size of the charge reduction gate, the overall size and dimensions of the CCD device, and desired operational parameters. However, in the experiment of the arrangement shown in FIGURE 3, charge reduction frequencies of 1225 to 4900 pulses per integration period were effectively used.

Figure 5A:
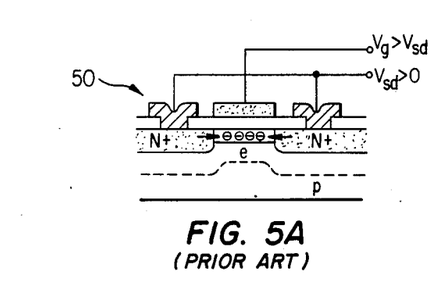
FIG. 5A illustrates an enlarged cross-sectional view of a prior art MOS device.
Figure 5B:
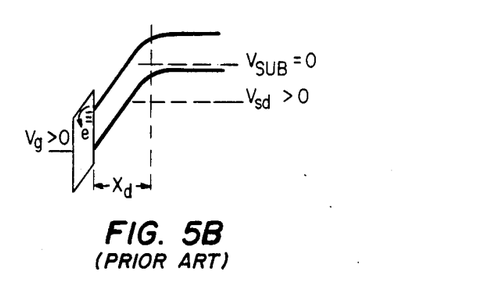
FIG. 5B illustrates a band diagram for the structure shown in 5A illustrating electron trapping in interface traps.
Figure 6A:
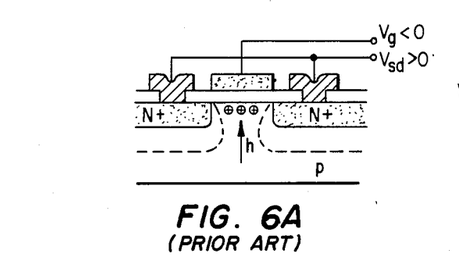
FIG. 6A illustrates an enlarged cross-sectional view of a prior art MOS device.
Figure 6B:
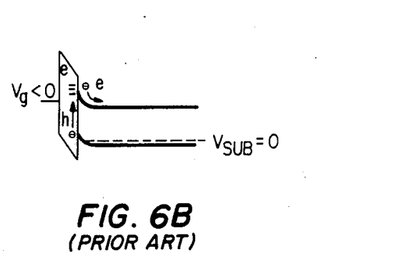
FIG. 6B is a band diagram illustrating trapping of holes at the interface in order to provide recombination with the trapped electrons.

In order to fully understand the operation of the present charge reduction technique, basic physical principles utilized in electron-hole recombination will now be described. There is a well-known technique used for characterization of MOS interface states called the "Charge Pumping Technique" described in *Solid-State Electronics*, vol. 19, pp. 241-247, 1976 by A.B.M. Elliot. This technique is illustrated in its basic form in FIGURES 5A-B and 6A-B. In a standard n-channel MOS transistor illustrated by 50 in FIGURE 5A, electrons fill the channel between the source and drain as soon as the gate voltage is larger than the threshold voltage, which is determined by the source to substrate bias, gate oxide thickness, substrate doping concentration and the like. Some of these electrons will be trapped in interface traps, as is illustrated on the associated band diagram FIGURE 5B for FIGURE 5A. If the gate voltage is now switched rapidly to some appropriate negative level as shown in FIGURE 6A, the electrons from the channel will flow back to the source and drain, and holes from the substrate will be attracted to the interface. The electrons previously trapped at the interface will not be able to escape immediately, and will create a population of filled electron traps at the same time as the larger population of holes builds up in the valence band. This phenomenon is illustrated by the band diagram of FIGURE 6B. This leads to an enhanced probability for direct recombination, and the trapped electrons will now quickly recombine with holes.

Of course, holes can also be trapped at the interface in corresponding hole traps, and will then recombine with electrons after the gate is switched back to its positive level. As this double action is repeated, it causes a net current flow from the source and drain regions into the substrate. The magnitude of this current will depend on the frequency of the transitions, density of electron and hole interface traps, and the carrier emission time constants. With the assumption that the trap distribution in energy consists of a continuum of mutually noninteracting levels, the following equation for the trapped electron density as function of the time and energy can be written.

$$n_e(E_{tc}, t) = n_{eO}(E_{tc}) * \exp(-t/\tau(E_{tc})) \quad (1)$$

$$\tau(E_{tc}) = (v\sigma_e N_c)^{-1} * \exp(E_{tc}/kt), \quad (2)$$

wherein:
- $n_e(E_{tc}, t)$ = Density of filled electron traps per eV as a function of energy and time (cm$^{-2}$ eV$^{-1}$)
- $n_{eo}(E_{tc})$ = Density of filled electron traps per eV at time t=0 (cm$^{-2}$eV$^{-1}$)
- t = time
- $\tau(E_{tc})$ = Trap emission time constant as a function of trap energy level of electrons measured from a corresponding band (eV)
- v = Electron thermal velocity (cm*s$^{-1}$)
- Nc = Density of states in a conduction band (cm$^{-3}$)
- kT = Thermal energy (eV)
- $\sigma_e$ = Electron capture cross section (cm$^2$)

The total number of electrons remaining trapped after time t, termed $N_{te}(t)$, will then be obtained by integration over all possible energy states within the energy band gap:

$$N_{te}(t) = \int_0^{E_g} n_{eo}(E_{tc}) * \exp((-tv\sigma_e N_c) * \exp(-E_{tc}/kT))dE'_{tc} \quad (3)$$

The total current, considering also a similar expression for holes, will be:

$$1_r = f_g * q * A_g * (N_{te}(t_e) + N_{th}(t_h)), \quad (4)$$

wherein:
- fg = Gate clocking frequency (s$^{-1}$),
- q = Electron charge (coulomb),
- $A_g$ = Charge reduction gate area (cm$^2$),
- $N_{te}(t)$ or $N_{th}(t)$ = Density of filled electron or hole traps as a function of time (cm$^{-2}$).

It is assumed that a certain time $t=t_e$ and $t=t_h$ is necessary to accomplish the transition from the positive level to the negative level and vice versa. It is also assumed that the recombination occurs within times negligible compared to $t_e$ and $t_h$. The recombination will cause emission of a phonon as the most likely candidate; however, if the probability of photon emission is not zero, the resulting photon will be of sufficiently low energy that a reabsorption in the silicon, and thus generation of new electron-hole pair, will not occur.

In the charge pumping operation described above, the surface trap recombination mechanism removes electrons supplied from the source and drain regions. This is directly analogous to the elimination of electrons which are generated optically by imaging devices. Eliminated electrons can also be generated by other means, for example X-ray or gamma rays incident on the CCD devices.

Figures 7A, 7B:
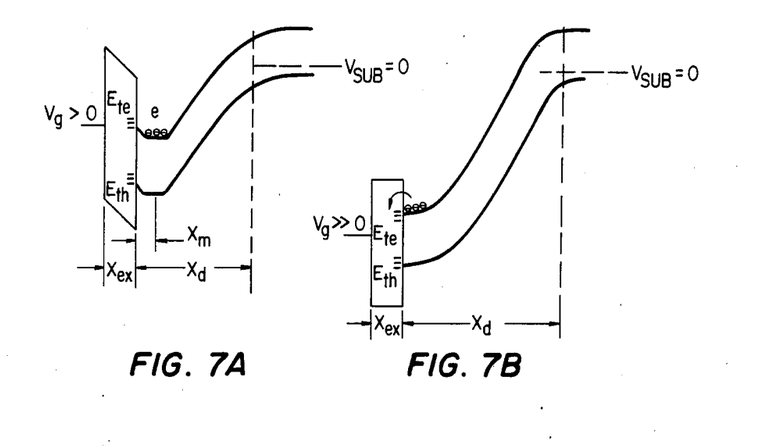
FIGS. 7A and 7B are band diagrams of a typical buried-channel charge coupled device structure illustrating trapping of electrons and holes at interface traps.

A typical energy band diagram for a buried-channel device structure is shown in FIG. 7A, wherein:
- $V_g$ = gate bias
- V sub = substrate bias,
- $E_{th}$ or $E_{te}$ = Trap energy level of holes or electrons measured from a corresponding band (eV)
- $X_{ox}$ = oxide thickness,
- $X_m$ = Distance of potential energy minimum from the interface (cm), and
- $X_d$ = Depletion width.

In FIG. 7A, it can be observed that electrons are positioned away from the interface in the vicinity of the location of the channel potential energy minimum $X_m$. This is the main feature which allows utilization of the buried-channel structure to prevent charge trapping at the interface and loss of charge transfer efficiency. It is well known that for a given gate bias, there is a corresponding charge level in the channel at which the electron quasi-Fermi level is just slightly below the interface energy level, near flat band condition. If the gate bias is now increased from this initial condition, charge will come into contact with the interface, as shown in the band diagram in FIG. 7B, and electrons will fill the interface traps. For electron-hole recombination to occur, it is necessary to also bring holes to the interface. This is achieved by applying a negative gate bias and drawing the necessary charge from the large supply of holes available from the channel stop regions in the direction perpendicular to the plane of the drawing in FIG. 7B. The potential at the interface is pinned at the substrate level when the holes from the channel stop regions cover the interface, thus resulting in a phenomenon known as surface potential pinning.

This surface potential pinning is employed in virtual phase CCD technology to increase charge handling capacity and minimize dark current generation, but can occur in any buried-channel device structure with appropriate gate bias. It is now seen that if the gate is pulsed between the negative bias $V_g < V_p$, where $V_p$ is the surface pinning threshold, and some positive bias, there will be a certain maximum charge level which can be stored in the channel, and any charge collected above this maximum will be subject to removal via the electron-hole recombination process. This principle is the basic mechanism used for the electron-hole recombination charge overflow control. It is only necessary to pulse the gate frequently enough that the recombination rate outpaces the total charge generation rate.

Figure 8:
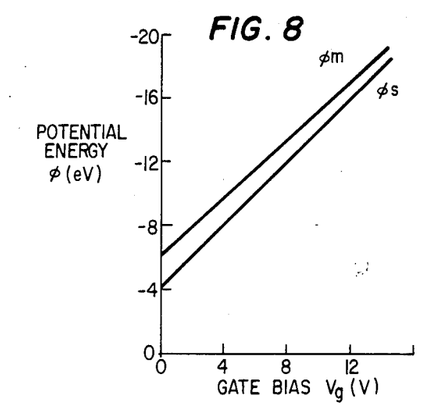
FIG. 8 is a graph illustrating the dependency of surface potential energy and minimum potential energy on gate bias of the structure shown in FIG. 1.
Figure 9:
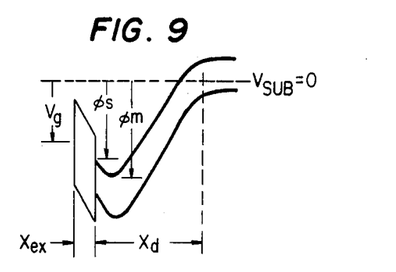
FIG. 9 is a band pass diagram further illustrating the dependency of surface potential energy and minimum potential energy on gate bias for the structure shown in FIG. 1.

To further understand the present invention, the variations of the surface potential and the channel potential minimum with gate bias are calculated and illustrated in FIG. 8, with the corresponding band diagram shown in FIG. 9, wherein:
- $\phi_m$ = Minimum potential energy,
- $\phi_s$ = Interface potential energy.

It may be noted from these figures that the difference between the surface potential and the channel potential minimum is not very strongly dependent on the gate bias, and, therefore, without the present anti-blooming gate structure, it would be necessary to go to extremely high bias levels to achieve complete charge removal by the electron-hole recombination mechanism. This is not always practical since in the channel stop regions the oxide field has a reversed polarity and rises rapidly towards its dielectric breakdown value with increasing gate voltage. Therefore, it is necessary to utilize an area difference between the virtual well and the charge reduction gate in order to accomplish the desired charge reduction.

This can be understood from several simplifying assumptions. First, it is assumed that the total amount of charge that can be stored under any gate is determined by the maximum charge storage density corresponding to that gate multiplied by the area of the gate. Second, the charge storage density is assumed to be the same for all gates. Third, it is assumed that the charge can be clocked from one gate to another by applying an appropriate bias without changing the storage capacity. In this case, if the charge is clocked from a gate with a large area where it filled that area to its maximum storage capacity into a gate with a smaller area, the charge will necessarily overflow to the interface under the smaller gate. By repetitive clocking of the charge back and forth, making certain that the pinning threshold is always crossed and holes supplied to the interface, this overflow charge will be removed by recombination. However, there will always be some charge left which cannot be removed and which is equal to the charge storage capacity of the smaller gate. It is thus necessary in actual device design to optimize the charge reduction gate area to achieve the desired level of charge removal. At the same time, however, it is necessary not to reduce the active surface area excessively, and the number of interface traps with it, so as not to make the charge recombination rate ineffective in practical overload conditions.

If it is desired to use the "pseudo-interlace" mode of operation, the amount of signal removed from the virtual well must exceed one-half of the full well capacity. The clocked well is then held at a bias resulting in collection of the other half of the full well. The appropriate wells are then combined together just prior to the fast shift into the memory section.

An experiment was performed to measure the number of electrons recombined per charge reduction gate pulse, and thus essentially a measurement of the number of active interface traps participating in the process. In this experiment, using the system shown in FIG. 3, a laser spot was projected on the imaging section of the device and the charge reduction gate was operated in the normal mode. The intensity of the laser was adjusted to provide only a small group of overloaded pixels in this operating mode. The charge reduction gate was then switched to a dc level. This resulted in blooming over a larger number of pixels. The additional blooming pixels served as a measure of the number of electrons generated by the laser input which are removed by the charge reduction gate in the normal mode, and thus as a measure of the corresponding recombination rate. In the next step, the number of charge reduction gate pulses was varied and the intensity of the laser was adjusted to obtain the identical number of overloaded pixels as in the previous case. The charge reduction gate pulses were again turned off and the number of blooming pixels counted.

Figure 10:
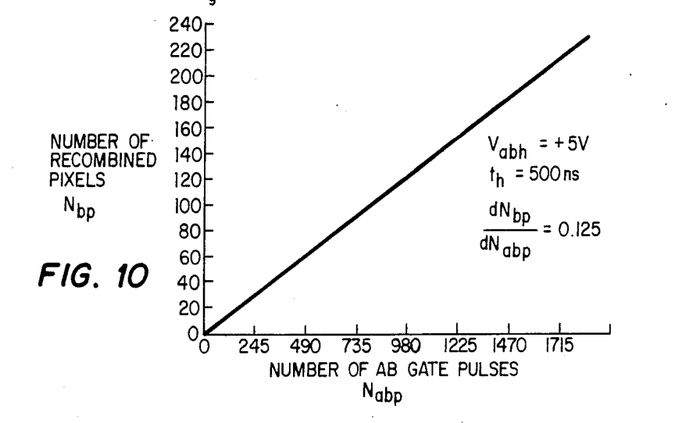
FIG. 10 is a graph illustrating the rate of charge recombination expressed as a number of blooming pixels removed by a corresponding number of anti-blooming gate pulses per integration period.

This data is plotted as number of blooming pixels versus number of charge reduction gate pulses in FIG. 10, with the device parameters of $$V_{abh} = +5v, \ t_h = 500ns \text{ and } dN_{bp}/dN_{abp} = 0.125$$

noted thereon. Knowing the full well capacity of this device and the area of the charge reduction gate, the sum of the electron and hole trap density can now be obtained using the following formula:

$$N_{te} + N_{th} = (N_{fw}/A_g)*(dN_{bp}/dN_{abp}), \quad (5)$$

wherein:
$N_{fw}$ = Maximum number of electrons in a well,
$N_{bp}$ = Number of blooming pixels,
$N_{abp}$ = Number of anti-blooming pixels.

Full well capacity of this device was measured to be $N_{fw} = 200,000$ e−, and the anti-blooming gate area, subtracting the area of the channel stops, is $$A_g = 4*10^{-7} \text{ cm}^2. \quad (6)$$

From the graph in FIG. 10, $$dN_{bp}/dN_{abp} = 0.125 \quad (7)$$

This gives a total trap density of $6.3*10^{10}/\text{cm}^2$. The result obtained correlates well with the typical interface state density for $SiO_2$—Si interfaces.

Another experiment was performed to obtain data on emission times of trapped electrons and holes on a device employing the present device. The values of these parameters, and the variation of these values with temperature, are important for practical applications of the recombination charge reduction concept. In particular, it is necessary to know the values of these parameters in order to determine the time that is allowed between trapping of one type of carrier and bringing the other type to the interface for recombination. If the trap emission time is very short, it may not be practical to switch the charge reduction gate bias fast enough to accomplish the recombination. The achievable switching speed may be limited by external considerations such as driver speed and power, or it may be limited by the pulse propagation delays within the imager and the RC time constant of the gate itself.

Figure 11:
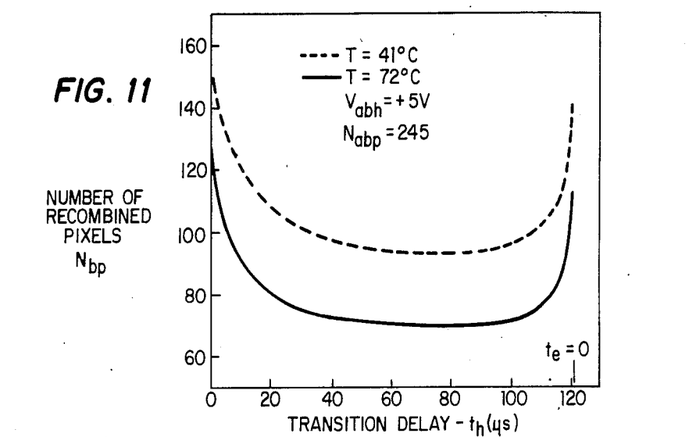
FIG. 11 is a graph illustrating transition delay dependency of trapped electrons and holes using the present invention.

The emission time measurement experimental setup was again arranged as shown in FIG. 3, but with the resolution target 48 removed. The CCD 36 was operated using the timing shown in FIGS. 4A-C. In this experiment, the delays $t_h$ and $t_e$ were changed, leaving the charge reduction gate clocking frequency and the remainder of the parameters constant. THe delay $t_h$ was used to measure the hole emission time and the delay $t_e$ was used to measure the electron emission time. In this experiment, as in the previous experiment, the number of overloaded pixels was maintained at a fixed value by adjusting the delays $t_h$ and $t_e$ while the laser intensity was varied. The change in the level of the recombination rate was then found by turning the charge reduction gate pulses off and counting the change in the number of overloaded pixels. The results of this experiment are plotted in FIG. 11, for two different temperatures 41° C. and 72° C. From the graph of FIG. 11, it can be seen that the recombination rate follows qualitatively the dependency predicted by equation (4) and that both the electron and hole emission times are larger than several microseconds, even at elevated temperatures. The finite and given emission rate of carriers, holes in particular, from interface traps which are refilled at each clock cycle implies that a certain minimum transition time is required for the described generation-recombination processes to be active. In addition, if the device pulse propagation delays also permit a short positive charge reduction gate pulse duration, the hole traps can be maintained filled for most of the charge reduction gate pulse cycle and thus the interface generated dark current can be quenched. Therefore, the low dark current feature of virtual-phase technology accomplished by surface pinning of the clocked gate can be preserved even if the charge reduction gate is clocked.

Figure 12:
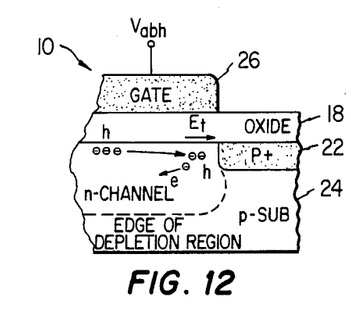
FIG. 12 is an enlarged partial sectional view of the structure shown in FIG. 1 illustrating the hot-hole impact ionization effect causing increase in a dark level signal.
Figure 13:
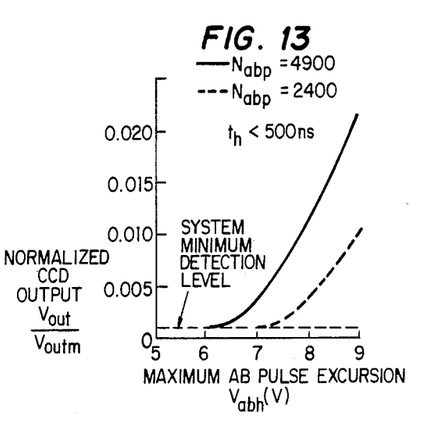
FIG. 13 is a graph of the dark level signal of the device shown in FIG. 1 as a result of positive excursion of anti-blooming gate pulses for two different numbers of pulses per integration periods.

Another experiment performed with this device was aimed at evaluation of hot-hole effects. There is a component of the dark current which is induced by the clocking. This dark current results from impact ionization by holes returning, after the pinning of the clock interface, back to the channel stop and the virtual gate area. The process is analogous to one occurring in p-channel MOS devices where it is known as substrate current. The effect is illustrated in FIG. 12, which shows an enlarged portion of FIG. 1. After the charge reduction gate potential is switched from below the pinning level back to a positive bias, some holes are left beneath the gate. Since the gate bias is now high, there will be a large fringing field between the clock gate edge and the virtual-phase gate edge. The residual holes leaving the clocked gate area will be traveling across this field back to the P+ region and if the field is large, the holes will be heated and cause impact ionization. This ionization will produce additional electron-hole pairs and the electrons will be collected as an unwanted signal. Since it is necessary to clock the charge reduction gate many times during the integration period to provide efficient anti-blooming protection overload, the resulting ionization effect is multiplied many times and could cause a substantial increase in the CCD background dark current level. The hot-hole effect can be minimized by reducing the fringing fields using methods adapted from standard MOS devices design and fabrication techniques for reduction of substrate currents. FIG. 13 is a graph showing the dependency of the dark level on the maximum excursion of the charge reduction gate pulse for two different number of clock pulses (2400 and 4900) during the integration period. As expected, the pixel dark level rises as the electrical field is increased very rapidly past a certain threshold, and it is also proportional to the number of charge reduction gate pulses.

Figure 14:
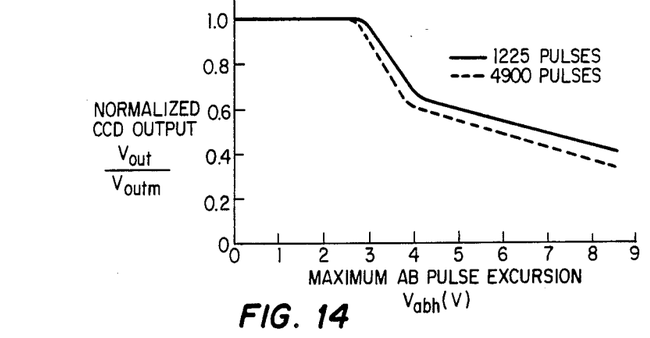
FIG. 14 is a graph of charge removal from the device shown in FIG. 1 as a function of the maximum excursion of anti-blooming pulses using two different frequencies of anti-blooming pulses.

Another experiment was conducted to measure the level of residual charge which is not removed from the anti-blooming gate via surface trap recombination. The device illumination level was adjusted in the system shown in FIG. 3 to obtain a full well signal output and the high level of the charge reduction gate clock pulse was gradually increased. The low level of the charge reduction gate clock pulse was kept below the surface pinning threshold $V_p$. The results of this experiment are shown in FIG. 14, which illustrates normalized CCD output as a function of maximum charge reduction pulse excursion. From the data shown, it is clearly evident that at the level $V_{abh}=3$ V, the charge reduction gate overflows and the charge recombination mechanism becomes active. The amount of charge removed is now directly proportional to the gate bias as more and more charge is attracted to the charge reduction gate area.

As shown in FIG. 14, finally at $V_{abh}=4$ V, all the charge from the virtual well is attracted under the charge reduction gate and no further charge is recombined. The signal which is left is then the well capacity of the charge reduction gate, which for this design is equal to approximately 60 percent of the total device capacity. If the charge reduction gate bias is increased past this point, the amount of charge removed is now governed by the reduction of the difference between the surface potential and channel minimum potential, which is not a strong function of the gate bias as was illustrated in FIG. 8 and is clearly visible in FIG. 14. The measurement was repeated with a different gate clocking frequency (4900) to make certain that the recombination rate is much larger than the signal generation rate in all portions of the graph.

The optimum operating point for the charge reduction gate pulse amplitude and the optimum number of pulses per integration period for anti-blooming control can now be determined from the graph in FIG. 13, the graph in FIG. 14, and the desired overload protection capability.

From the results of the experiments described previously and from the description of the device operation, the device performance can be summarized by evaluating the three most important parameters: overload capacity, dark current, and quantum efficiency.

Overload capacity: This parameter is best expressed in number of device full well exposures "X" that can be handled by the present charge reduction structure when used for anti-blooming. Assuming that the light source was projecting its energy onto the imager only for a portion of the total integration time, the following equation can be constructed:

$$X = t_{ex} * f_g * (dN_{bp}/dN_{abp}), \qquad (8)$$

wherein
$t_{ex}$=exposure time, and
$f_g$=gate clocking frequency (s$^{-1}$)

From this equation it is seen that the overload capability of the electron-hole recombination anti-blooming is diminished if the light pulse duration is short. However, this is not a problem in most movie camera applications where the exposure time is equal to the field readout time and the illumination does not vary rapidly with time.

Considering a standard TV system for example, the readout time is approximately 16 ms and if the anti-blooming gate pulse frequency is chosen to be 150 kHz, the overload capacity will be:

$$X = 16 * 10^{-3} * 1.5 * 10^5 * 0.126 = 302. \qquad (9)$$

This level of overload protection is satisfactory for all practical applications, such as sunlight reflections from chrome trimmings on cars in parking lots or reflections from eyeglasses in portrait-type scenes.

Dark current: Addition of a charge reduction gate to the device structure does not increase the surface generated dark current significantly, as was explained previously. Thus the low dark current feature of virtual phase technology is still preserved. It is, however, necessary to pay attention to hot-hole effects. As can be seen from the graph in FIG. 13, this is not a problem in correctly designed devices for low clocking frequencies such as 150 kHz. Addition of a substantial hot-hole induced dark current would reduce the dynamic range of the device and the signal-to-noise ratio.

Quantum efficiency: This parameter is easily evaluated from the topology of the unit cell given in FIG. 1. Absence of the drains makes the quantum efficiency similar to that for devices without charge reduction. If, in addition, the gate is fabricated from a transparent and conductive material such as $SnO_2$ and the device is coated with anti-reflection material, the quantum efficiency can approach 100 percent. This is unparalleled in other prior anti-blooming structures and becomes critically important for applications such as high-resolution color CD cameras.

In addition to anti-blooming, the structure shown in FIG. 1, may be used for other charge reduction functions such as electronic aperture control and also for gamma correction. When used with electronic aperture control, the charge is essentially destroyed during certain portions of the integration time and signals allowed to accumulate only for a selected portion of the integration time prior to shift to the memory. This operation is the equivalent of closing the peak stop of the lens. It is also possible to gradually lower the amplitude of the charge reduction clock to effect the time-charge generation ratio which results in effective gamma ratio different than unity.

Figure 15A:
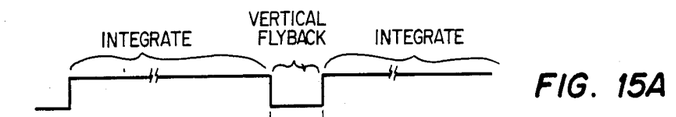
FIGS. 15A-D illustrate various clocking signals applied to an array of devices of the type shown in FIG. 1 when used in conjunction with a typical video system to prevent anti-blooming effects.
Figure 15B:
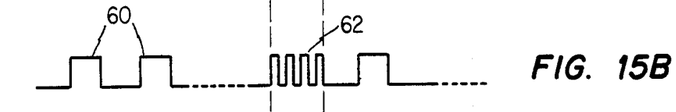
Figure 15C:
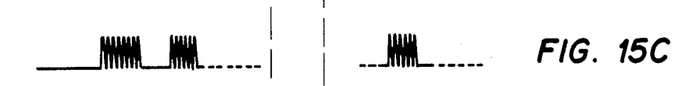
Figure 15D:
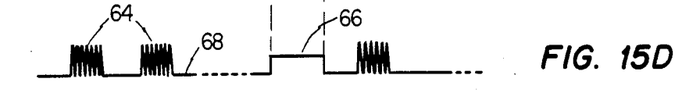

FIGS. 15A-D illustre an example of the use of the VP CCD imager shown in FIG. 1 for TV camera applications. FIG. 15A illustrates the integration and vertical fly back timing modes of the VP CCD 10. FIG. 15B illustrates the timing of the transfer from the memory to the serial register line-by-line. The interconnection of a VP CCD memory to a serial register is well known, and is not herein illustrated. The pulses 60 provide timing for the horizontal fly back of the TV camera and the pulses 62 occur during the vertical fly back time for frame transfer from the imaging section to the memory section. FIG. 15C illustrates the line readout timing for the serial register, the readout pulses occuring between the horizontal fly back pulses 60. FIG. 15D illustrates the timing for the charge reduction gate of the device as illustrated in FIG. 1. It may be seen that the pulses 64 operate to destroy charges as previously described. Intermediate DC level 66 is provided so as not to affect the charge transfer during the vertical fly back time. It is advantageous to have the DC level 68 less than the $V_p$ threshold in order to minimize dark current generation. The magnitude of the pulses 64 must be sufficient to provide charge reduction by electron hole recombination as previously described. It is not necessary to continuously clock the pulses 64 during the horizontal feedback, for example, as it is possible to clock the pulses intermittently in bursts. Thus, burst pulsing having durations less than the readout time of an imaging system may accomplish the charge reduction of the invention.

Figure 16A:
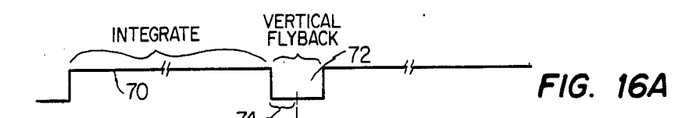
FIGS. 16A-B comprise clocking signals applied to an array of devices of the type shown in FIG. 1 when used to effect shutter control and gamma control.
Figure 16B:
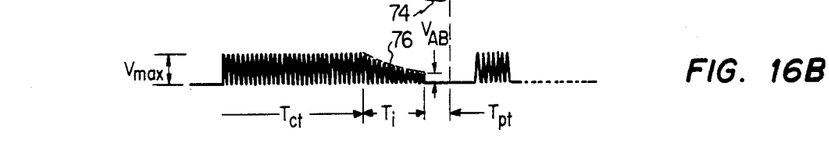

FIGS. 16A-B illustrate the use of the present VP CCD 10 for electronic exposure control and gamma correction. As previously noted, the present structure may be used not only for anti-blooming, but for electronic aperture control by destroying all the charge during certain portions of the integration time and allowing accumulation of charge only for a portion of the integration time immediately prior to shift to memory, thereby providing an equivalent to closing the f-stop of the lens. In addition, it is possible to gradually lower the amplitude of the charge control clock to effect the time charge generation ratio to provide effective gamma control. As shown in FIG. 16A, the integration period 70 may comprise, for example, approximately 15 milliseconds (NTSC standard). The vertical fly back period 72 is divided into a parallel transfer time 74.

The waveform of 16A comprises a typical TV camera operation with an integration period and a vertical flyback period. FIG. 16B illustrates the operation of the charge reduction pulses of the present invention in order to provide gamma correction. Time $T_{ct}$ represents all charge destroying time, wherein pulses at Vmax are provided to destory all charge within the VP CCD device 10. Time $T_i$ repesents the charge integration time in which the levels of the charge reduction pulses are gradually reduced as illustrated by the variable amplitude 76. During the charge integrate time $T_i$, gamma control is provided. The levels of the pulses are reduced to voltage $V_{ab}$ which comprises the standard anti-blooming operational level wherein only excess charge reduction is required to prevent blooming. The relationship between $T_{ct}$ and $T_i$ is variable, in dependency on the gamma correction desired. Time $T_{pt}$ represents the parallel transfer time. The sum of $T_{ct}$, $T_i$, and $T_{pt}$ comprises the NTSC standard of 15 milliseconds. The cycle shown in FIG. 16B repeats itself during further operation of the camera, and the relationship between $T_{ct}$ and $T_i$ may be automatically varied by a feedback mechanism dependent upon scene illumination.

Figure 17:
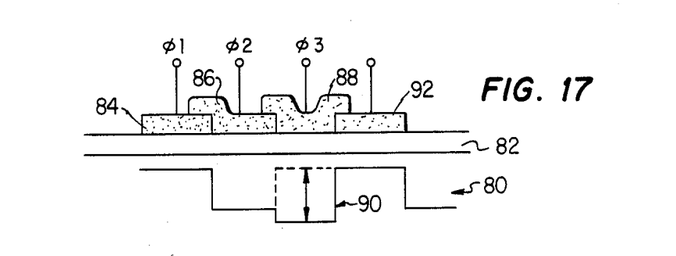
FIG. 17 is an enlarged sectional view of a three-phase charge transfer device incorporating the present anti-blooming invention.

The present charge reduction has been previously described with respect to a virtual phase CCD. As indicated, the present invention may also be utilized with other charge transfer devices such as a buried-channel CCD device. A three-phase buried channel CCD is illustrated in FIG. 17 and comprises a semiconductor substrate 80, an oxide layer 82, and terminals 84, 86 and 88 constructed in the conventional manner. Electrodes 84, 86 and 88 are numbered as terminals 1, 2 and 3 for ease of explanation.

In normal operating conditions of a buried channel CCD device, the gates are clocked between a $V_g$ low and a $V_g$ high signal. $V_g$ high is selected such that electrons are confined in a buried channel and do not come to the surface where they might be trapped by an interface trap. $V_g$ low is normally determined by the point where interface is pinned and holes come to the interface.

In the present invention, however, the gate $\phi_3$ is clocked above $V_g$ high to $V_g$ high plus, such that the excess electrons from the channel become trapped in the interface state. $\phi_3$ is then also clocked below the normal $V_g$ low to $V_g$ low minus, such that holes will come to the surface and recombine with the trapped electrons. This non-radiative/radiative (via traps) recombination will destroy the amount of charge proportional to the interface state density. It may become necessary to pulse gate $\phi_3$ several times in rapid succession to pump out the desired amount of overflow charge. In order not to cause a charge transfer, it is necessary to hold an adjacent electrode to the clocked electrode at a DC blocking potential.

For example, referring to FIG. 17, in operation with the present technique, $\phi_1$ is held low to block charge transfer and $\phi_2$ is held high to store charge. $\phi_3$ is pumped as described with a charge reduction pulse to destroy the overflow charge. The pumping operation of $\phi_3$ electrode is illustrated by the potential region 90 in FIG. 17. Electrode 92 comprises the first electrode in the next sequential three phase electrode combination. The present invention may thus be utilized with buried channel CCD devices and other charge transfer devices to provide anti-blooming and other functions utilizing the electron-hole recombination technique.

Figure 18:
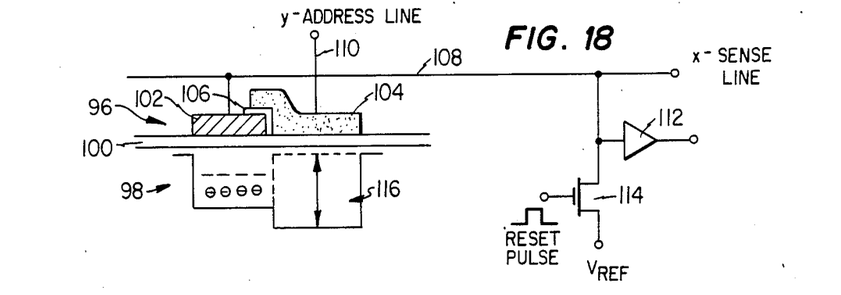
FIG. 18 is an enlarged sectional view of a charge injection device utilizing the present charge removal technique to provide CID readout and to effect anti-blooming control.

FIG. 18 illustrates a charge injection device (CID) which may be operated according to the present electron-hole recombination technique to provide enhanced operation. As is known, the CID device 96 is formed on a semiconductor substrate 98 and includes an oxide layer 100, an electrode 102, and an electrode 104 separated by a non-conductive layer 106. As is conventional, when used as an imager, the illustrated CID device is constructed such that the signal at each photo site is detected in an X-Y fashion as in a random access memory. In normal operation, when the potential on both electrodes 102 and 104 is simultaneously lowered, the charge is injected into the substrate and recombined therein. The terminal 102 is connected via lead 108 to operate as a X minus sense line. Terminal 104 is connected to lead 110 which operates as a Y minus address line. The X minus sense line is connected to a sense amplifier 112 and also to one terminal of a FET transistor 114. A reset pulse is applied to the gate of the FET 114 and a V reference voltage is applied to the remaining electrode of the FET 114.

As is known, when the illustrated CID device is operated as an imager, charge is accumulated in a well during the integration period. The X sense line 108 is reset to $V_{ref}$ by a reset pulse applied to the gate of the FET 114. The sense line is then left floating. The amplifier 112 will now sense change in the potential on the sense line 108 due to the change in the amount of charge.

In operation of the present invention, a burst of charge reduction pulses to the address line 110 will serve to pump the electrode 104 in the previously defined manner in order to cause electron-hole recombination to destroy charge. This willcause the charge to disappear from the well and will change the potential of the sense line 108. The photo site is then ready to integrate the new signal. The volage potential waveform of FIG. 18 illustrates the operation of the present technique, with the charge pumping area being illustrated generally by numeral 116.

With the present invention, it is thus not required to rely upon charge injection to the substrate to provide charge extraction. Such injection used by previous devices is slow and often causes charge spreading into the neighboring cells. With the present invention, the substrate may be of a very long lifetime and may have a very high quantum efficiency.

It will also be understood that anti-blooming may be provided to CID 96 in accordance with the present technique by constantly clocking the unaddressed electrodes at lower amplitudes than is required for the charge destroying technique noted above. In this manner, only the overflow charge is destroyed as previously described.

The device shown in FIG. 18 thus provides an improved technique of charge extraction from photocells. The technique may be used in normal CCD devices, including surface channel and buried channel. The technique is particularly useful in CID devices with applications in the infrared field. As previously noted, the technique may be used as an automatic exposure control in CCD imagers and also for gamma correction. The technique may also be used as a readout scheme for RAMS and ROM memory.

It will thus be seen that the present technique of electron-hole recombination has a wide range of applications for a variety of charge transfer devices, both to provide anti-blooming operation as well as to provide exposure control, gamma control and improved readout techniques.

Although the preferred embodiment has been described in detail, it should be understood that various changes, substitutions and alterations can be made therein without departing from the spirit and scope of the invention as defined by the appended claims.

What is claimed is:

1. A charge transfer imaging device having charge removal capabilities comprising:
    a semiconductor substrate of one conductivity type having a pair of spaced regions of higher impurity level of said one conductivity type and including means to effect charge transfer along a channel therein,
    an insulating layer on said substrate over said channel,
    at least two electrodes disposed over said insulating layer, said spaced regions being disposed between said electrodes,
    first means coupled to said electrodes for receiving and applying to said electrodes charge transfer clocking pulses,
    a charge removal gate disposed between said spaced regions and adjacent and spaced from said electrodes, and
    second means operable in a first mode to apply pulses of a first amplitude sufficient to remove charge to reduce blooming and operable in a second mode to apply pulses of a higher amplitude than said first amplitude in order to provide imaging exposure control coupled to said charge removal gate for applying pulses to said charge removal gate in order to remove charge through electron-hole recombination through interface traps of electrons and holes.

2. The imager device of claim 1 and further wherein:
    said means for applying pulses is successively operable in said first and second modes for decreasing the amplitude of the pulses from the exposure control level to the reduced blooming level in order to vary the effective gamma of the imaging device.

3. The device of claim 1 and further comprising:
    a buried channel of opposite conductivity type for charge transfer, and
    virtual phase means including successive regions of impurity concentrations higher than said substrate.

4. The device of claim 3 wherein said clocking pulses exceed the surface pinning threshold of said imaging device and wherein the frequency of said clocking pulses is sufficient to remove charge from said imaging device by an electron-hole recombination process through interface traps of electrons and holes.

5. The device of claim 1 wherein said conductive layer forms a charge coupled device having three phase electrodes, one electrode being held at a low dc potential to block charge transfer, a second electrode held high to store charge and a third electrode forming said charge removal gate for receiving clocking pulses.

6. A charge transfer imaging device having charge control properties comprising:
    a semiconductor substrate of one conductivity type including a channel for charge transfer,
    an insulating layer on said substrate over said channel,
    a plurality of spaced apart conductive electrodes disposed on said insulating layer over said channel,
    said channel divided into a clocked phase and a virtual phase between each adjacent electrodes, each phase including a storage and a transfer region,
    each said clocked phase and virtual phase comprising a cell of at least two regions having different impurity profiles, and
    a charge control gate electrode disposed between adjacent electrodes for receiving charge control clocking pulses to remove charge from said device by electron-hole recombination through interface traps of electrons and holes
    wherein the device is clocked in an integration mode and a fast shift mode, in said integration mode said conductive electrode held at a dc potential and said charge control gate pulsed with said charge control clocking pulses to remove overflow charge to reduce blooming, in said fast shift mode said conductive electrode pulsed to facilitate fast charge transfer and said charge control gate held at a dc potential.

7. The imaging device of claim 6 wherein said charge control gate is pulsed with intermittent bursts of said charge control clocking pulses.

8. The imaging device of claim 6 wherein said charge control clocking pulses reduce charge during a portion of said integration mode and allow accumulation of charge prior to end of said integration mode to provide effective aperture control of the device.

9. The imaging device of claim 6 wherein the amplitude of the charge control clocking pulses are lowered during at least a portion of said integration mode to provide an effective gamma different from unity.

* * * * *